United States Patent [19]

Sanada

[11] Patent Number: 5,388,077
[45] Date of Patent: Feb. 7, 1995

[54] TEST DEVICE FOR SEMICONDUCTOR MEMORY DEVICE

[75] Inventor: Kohji Sanada, Tokyo, Japan

[73] Assignee: NEC Corporation, Tokyo, Japan

[21] Appl. No.: 27,762

[22] Filed: Mar. 8, 1993

[30] Foreign Application Priority Data

Mar. 9, 1992 [JP] Japan .................. 4-050216

[51] Int. Cl.6 .............................................. G11C 29/00
[52] U.S. Cl. ..................................... 365/201; 365/226; 371/21.1
[58] Field of Search ............... 365/201, 226; 371/21.1, 371/21.4

[56] References Cited

U.S. PATENT DOCUMENTS 5,079,744  1/1992  Tobita et al. ...................... 365/201
5,159,571 10/1992  Ito et al. ............................ 371/21.1 X

FOREIGN PATENT DOCUMENTS 0303971  2/1989  European Pat. Off. ......... 365/189.1

Primary Examiner—Eugene R. LaRoche
Assistant Examiner—Son Dinh
Attorney, Agent, or Firm—Popham, Haik, Schnobrich & Kaufman, Ltd.

[57] ABSTRACT

There is shortened a test time to ensure data holding power supply voltage. A power supply voltage reduction circuit 3 is provided which reduces power supply voltage Vcc supplied to a power source supply terminal to a predetermined level. Further, a test mode judgement circuit 4 is provided which judges an undergoing test mode to be a data holding power supply voltage test mode and issues an active level test mode signal TM. A switching circuit 5 is further provided which is operable with an output from the power supply voltage reduction circuit 3 as power supply voltage when the test mode signal TM is at an active level to restrict an output data level of said data input buffer circuit 2 and supplies restricted voltage to a memory cell 1 while being operable with the power supply voltage Vcc on the power source supply terminal intactly as the power supply voltage when said signal TM is at an inactive level to supply the output data of the data input buffer circuit 2 to the memeory cell 1.

6 Claims, 2 Drawing Sheets

TEST DEVICE FOR SEMICONDUCTOR MEMORY DEVICE

BACKGROUND OF THE INVENTION

1. Field of the Invention

The present invention relates to a semiconductor memory, and more specifically to a semiconductor memory capable of ensuring data holding power supply voltage.

2. Description of the Priro Art

In semiconductor memories each including static memory cells with high resistance polycrystalline silicon load elements, a value of power supply voltage for data holding is ensured in order to hold memory information with the aid of a battery.

In case ensurance of minimum data holding power supply voltage of 2.0 V is desired, for example, its test is conducted by writing any information in a semiconducor memory at ordinary power supply voltage (e.g., 5.0 V), and thereafter switching the operation to a standby state and then holding the memory for a predetermined time at the power supply voltage lowered to 2.0 V, and reading out the information from the memory after the power supply voltage is returned to the initial one to bring the operation into an active state, for judgement of the quality of the ensurance of the power supply voltage.

Data holding time in the test of the data holding power supply voltage is calculated supposing the resistance of the high resistance load element and any leakage source of driver transistors of the memory cells.

FIGS. 1A and 1B illustrate a circuit diagram of a memory cell in a prior art semiconductor memory, and an equivalent circuit of the same, respectively.

The memory cell 1 of the semiconductor memory is comprised of driver N channel MOS transistors Q1, Q2 having their gate connected with counterpart drains and sources connected with a ground potential, high resistance load resistors R1, R2 each connected between the drains of the MOS transistors Q1, Q2 and a power supply terminal (power supply voltage Vcc), and N channel MOS transistors Q3, Q4 having their gates connected with a word line WL and being connected between the drains of the MOS transistors Q1, Q2 and first and second bit lines.

The drains of the transistors Q1, Q2 serve as storage nodes N1, N2 which nodes typically possess node capacitance Cn and leakage resistance Rn if existent. In the following, for values of the load resistors R1,R2, a leakage resistor Rn, and a node capacitor Cn, identical symbols to those ones shall be applied.

High level voltage Vh of each storage node (N1, N2) of the memory cell is herein expressed by:

$$Vh = Vcc \cdot Rn/(Rn+R1) \quad (1)$$

In order for each storage node to keep the high level, the following conditions must be satisfied:

$$Vh = Vcc \cdot Rn/(Rn+R1) > Vt \quad (2)$$

Herein, Vt designates threshold voltage of the transistors Q1 and Q2.

From the above equations (1) and (2), there is derived the following relation $$Rn > 1.5 \times 10^{12} [\Omega]$$

with the assumption of Vt to be 0.75 V and Vcc 2 V for example.

Estimation of the time t1 at which the high level storage node N1 becomes 0.75 V provides:

$$t1 = [Cn \cdot Rn \cdot R1 \cdot ln(Vcc/Ve)]/(Rn+R1) = 9.19 \times 10^{-3} s$$
(about 9.2 ms)

under the conditions of:

$$Cn = 10 \times 10^{-15},$$

$$Rn = 1.5 \times 10^{12},$$

$$R1 = 2.5 \times 10^{12},$$

Vcc = 2.0, and

Vt = 0.75

Once the high level storage node N1 becomes lower than the threshold voltage 0.75 V of the MOS transistor Q2, the MOS transistor Q2 is switched off while the low level storage node N2 is electrically charged through the load resistor R2 and hence initiates to increase its voltage. Once the storage node N2 reaches voltage exceeding the threshold voltage of 0.75 V of the MOS transistor Q1, the MOS transistor Q1 is switched on, and hence the levels of the storage nodes N1 and N2 are completely reversed to bring the memory cell into a failure one. Now, estimation of the time t2 at which the low level storage node becomes 0.75 V provides:

$$t2 = R1 \cdot Cn \cdot ln(Vcc/(Vcc-Vt)) = 11.75 \text{ msec.}$$

The data holding time t until the memory cell information is reversed is thus provided by:

$$t = 9.2 + 11.75 = 25.32 (ms)$$

Namely, a time greater than about 25.3 ms is required. Further, in the data holding power supply voltage test, time period T during which the high level information written in the memory cell reaches 2 V is required. The time T is expressed by:

$$T = R1 \cdot Cn \cdot ln(E/Vo) \quad (3)$$

where E denotes the high level voltage of the memory cell when the high level information has been written in the memory cell, and Vo is herein 2 V.

The written voltage E is typically lower than the operating power supply voltage by the threshold voltage Vt of the MOS transistor.

Assuming that the power supply voltage is 4.5 V for example, E = 3.75 V. It is understood from the equation (3) that T requires 15.7 ms or longer. Provided herein the power supply voltage is lowered to write information in the memory cell, it is possible to shorten the foregoing time T, but this is only for low voltage-operational semiconductor memories, and is severe even for semiconductor memories capable of ensurance of low voltage operation if they are to operate at 3.5 V or lower. Assuming that the power supply voltage is 3.5 V, E is 2.75 V and hence T requires 7.9 ms or longer. In actual tests, the time T ranges from several hundreds milli-seconds to several seconds or longerbecause it should be set to be longer by one through two digits usuallly in view of variations of fabrication of such semiconductor memories.

Further, in the use thereof at low temperature, the load resistances R1 and R2 are increased at the rate of square so that t as well as T are further increased. Provided the time T is insufficient to permit the storage node of the memory cell to satisfactorily lower to 2 V, the time t is further prolonged as a matter of course.

The prior art semiconductor memory suffers as described above from a difficulty that data is written therein at ordinary operating power supply voltage even upon the data writing in the data holding power supply voltage test so that enormous testing time is wastfully required to constitute a hindrance to production.

SUMMARY OF THE INVENTION

It is therefore an object of the present invention to provide a semiconductor memory capable of shortening the time required for the data holding power supply voltage test.

To achieve the above object, a semiconductor memory according to the present invention comprises a power supply voltage reduction circuit for reducing power supply voltage supplied to a power source supply terminal to a predetremined level, a test mode judgement circuit for judging an undergoing test mode to be a data holding power supply voltage test one and issuing an active level test mode signal, and a switching circuit which is operable with an output from said power supply voltage reduction circuit as power supply voltage when said test mode signal is of an active level to restrict an output data level from a data input buffer circuit and supply it to memory cells of the semiconductor memory while being operative with the power supply voltage at said power source supply terminal intactly as the power supply voltage when said signal is of an active level to supply the output data from said data input buffer circuit to said memory cells.

The above and many other advantages, features and additional objects of the present invention will become manifest to those versed in the prior art upon making reference to the following detailed description and accompanying drawings in which preferred structural embodiment incorporating the principles of the present invention is shown by way of illustrative example.

DETAILED DESCRIPTION OF THE PREFERRED EMBODIMENT

In what follows, a preferred embodiment of the present invention will be described with refeernce to the accompanying drawings.

Figure 2:
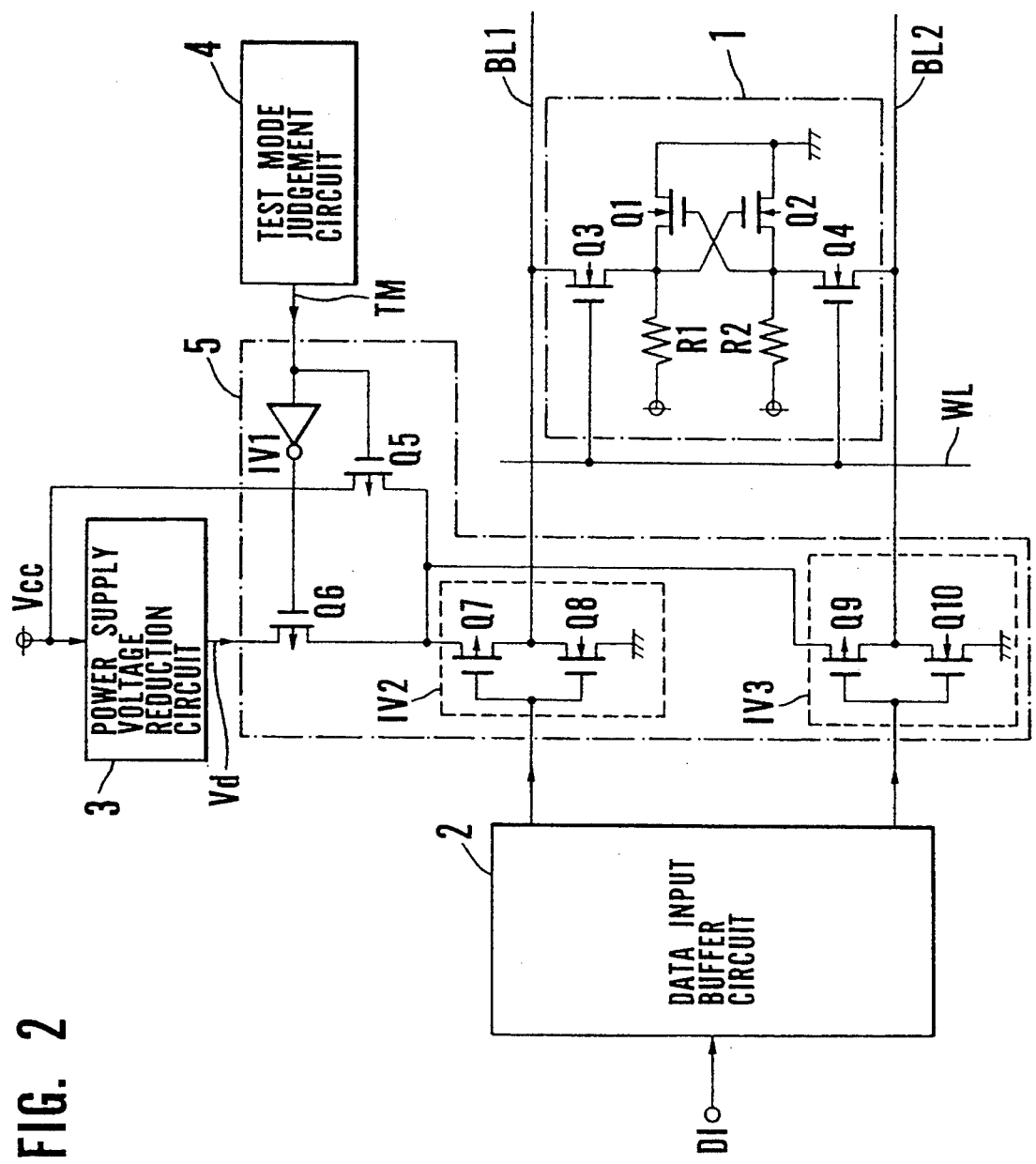
FIG.2 is a circuit diagram illustrating a preferred embodiment of a semiconductor memory according to the present invention.

Referring to FIG. 2, there is illustrated a semiconductor memory as an embodiment of the present invention.

Figure 1A:
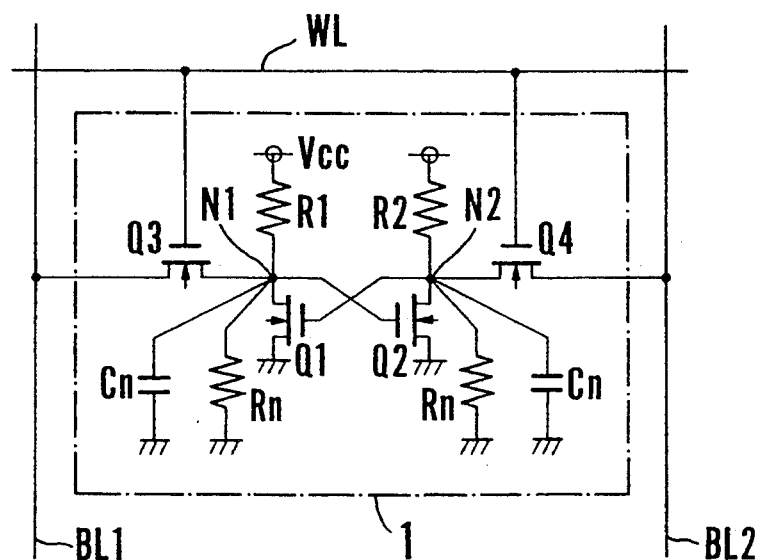
FIG. 1A is a circuit diagram exemprarily illustrating a memory cell of a prior art semiconductor memory.
Figure 1B:
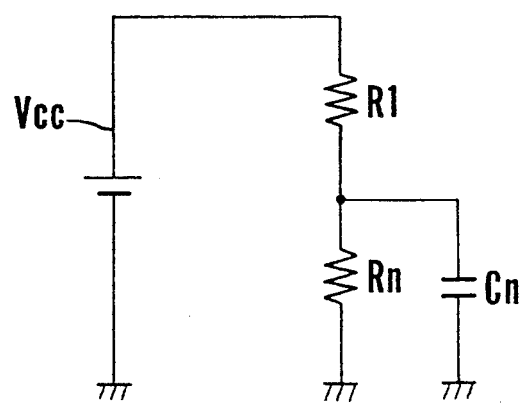
FIG. 1B is an equivalent circuit of the memory cell illustrated in FIG. 1.

An arrangement of and an interrelation among a memory cell 1, bit lines BL1, BL2, and a word line WL in the present embodiment are identical to those of the prior art semiconductor memory illustrated in FIG. 1A.

A data input buffer circuit 2 is to supply write data DI to the memory cell 1 through the bit lines BL1 and BL2, which circuit is conventionally connected at its output directly with the bit lines BL1 and BL2.

In the present embodiment, there are provided anew a power supply voltage reduction circuit 3 for reducing ordinary operation power supply voltage Vcc supplied to a predetermined level (Vd); a test mode judgement circuit 4 for judging an undergoing test mode to be a data holding power supply voltage test mode and issuing an active level test mode signal TM; and a switching circuit 5 which includes inverters IV2 and IV3 each for supplying output data from the data input buffer circuit 2 to the corresponding bit lines BL1 and BL2, an inverter IV1 as power supply voltage switching means for supplying power supply voltages to the inverters IV2 and IV3 by switching them with the test mode signal TM, and MOS transistors Q5 and Q6, and which is operable with an output Vd from the power supply voltage reduction circuit 3 as power supply voltage when the test mode signal TM is of an active level to restrict the output data level of the data input buffer circuit 2 and supply it to the memory cell 1 while being operable with the power supply voltage Vcc at the power source supply terminal intactly as the power supply voltage when said signal is of an inactive level to supply the output date from the data input buffer circuit 2 to the memory cell 1.

Operation of the present embodiment is as follows.

In the ordinary operation mode, the test mode judgement circuit 4 issues the inactive level (low level) test mode signal TM to switch the MOS transistor Q6 off and Q5 on, whereby the ordinary operation power supply voltage Vcc is supplied from the power source supply terminal to the inverters IV2 and IV3. Accordingly, the output data of the data input buffer circuit 2 is supplied to and written in the memory cell 1 through the bit lines BL1 and BL2 without being limited in its amplitude.

In the data holding power supply voltage test mode, the test mode judgement circuit 4 judges an undergoing test mode to be the data holding power supply voltage test mode and issues the active level (high level) test mode signal TM. Hereby, the MOS transistor Q5 is switched off Q6 on to supply the output voltage Vd of the power supply voltage reduction circuit 3 to the inverters IV2 and IV3 as power supply voltages thereof. Hereby, the bit lines BL1 and BL2 are merely driven up to voltage reduced by the power supply voltage reduction circuit 3 and hence the data level to be written in the memory cell 1 is lowered.

Provided the output voltage of the power supply voltage reduction circuit 3 is set to be 2 V upon the ordinary operation power supply voltage Vcc being at 5 V, for example, the high level written in the memory cell 1 reaches about 2 V which eliminates the need of a wait until the data holding power supply voltage reaches the ensured minimum data holding power supply voltage (2 V) when any information is written at 5V as in the prior art.

According to the present invention, as described above, a data amplitude is limited upon data writing in the memory cell in the test mode whereby there is eliminated the need of a wait until the ensured minimum data holding power supply voltage level is reached even with a semiconductor memory wherein ordinary operating power supply voltage is supplied to other associated circuits, so that the test time is successfully shortened.

What is claimed is:

1. A semiconductor memory comprising:
   data input buffer means for inputting write information;
   power supply voltage reduction means for reducing power supply voltage supplied to a power source supply terminal to a predetermined voltage level;
   test mode judgement means for issuing an active level test mode signal upon a data holding power supply voltage test mode;
   memory cell means for storing therein the write information; and
   switching means operable with an output from said power supply voltage reduction means as power supply voltage when said test mode signal is of an active level to restrict an output level of said data input buffer means to said predetermined voltage level and supply an output signal from said data input buffer means to said memory cell while being operable with said power supply voltage at said power source supply terminal intactly as the power supply voltage when said test mode signal is of an inactive level to supply output write information from said data input buffer means to said memory cell means.

2. A semiconductor memory according to claim 1 wherein said memory cell means comprises:
   a pair of first and second bit lines;
   a word line;
   first and second driver MOS transistors having gates connected with counterpart drains and sources connected with a reference potential point such as ground potential;
   first and second high resistance load means connected correspondingly between said drains of said first and second MOS transistors and the power source supply terminal; and
   third and fourth MOS transistors connected correspondingly between said drains of said first and second MOS transistors and said first and second bit lines and having gates both connected with said word line, said third and fourth MOS transistors being switched on when said word line is at a selection level.

3. A semiconductor memory according to claim 1 wherein said switching means comprises inverter means for supplying said output write information from said data input buffer means to the corresponding bit lines of said memory cell means, and power supply voltage switching means for switching power supply voltages for said inverter means with the aid of said test mode signal and supplying the power supply voltages to the inverter means.

4. A semiconductor memory according to claim 3 wherein said inverter means comprises two inverters which are connected correspondingly to said bit lines of said memory cell means.

5. A semiconductor memory according to claim 4 wherein each of said inverters comprise paired MOS transistors, each pair of the MOS transistors having commonly connected gates connected with the output of said data input buffer means and their commonly connected drains connected to corresponding said bit lines, and further one source connected with a reference potential point such as ground potential while the other source connected with said power supply voltage switching means.

6. A semiconductor memory according to claim and 3 wherein said power supply voltage switching means comprises an inverter with input terminal connected with said test mode judgement means, a MOS transistor having gate terminal connected with said input terminal of said inverter, drain terminal connected with said power source supply terminal, and source terminal connected with said inverter means, and a MOS transistor having gate terminal connected with an inverted output terminal of said inverter, drain terminal connected with the output of said power supply voltage reduction means, and source terminal connected with said inverter means, whereby the power supply voltage of said power supply voltage reduction means is supplied to said inverter means when said test mode signal is active while said power supply voltage at the power source supply terminal is supplied intactly to said inverter means when said test mode signal is inactive.

* * * * *